United States Patent
Neubauer et al.

(10) Patent No.: US 11,654,560 B2
(45) Date of Patent: May 23, 2023

(54) METHOD FOR COMPUTER-AIDED USER ASSISTANCE DURING THE ACTIVATION OF A MOVEMENT PLANNER FOR A MACHINE

(71) Applicant: Siemens Aktiengesellschaft, Munich (DE)

(72) Inventors: Werner Neubauer, Munich (DE); Philipp Sebastian Schmitt, Munich (DE)

(73) Assignee: SIEMENS AKTIENGESELLSCHAFT

( * ) Notice: Subject to any disclaimer, the term of this patent is extended or adjusted under 35 U.S.C. 154(b) by 302 days.

(21) Appl. No.: 16/251,174

(22) Filed: Jan. 18, 2019

(65) Prior Publication Data
US 2019/0224848 A1 Jul. 25, 2019

(30) Foreign Application Priority Data

Jan. 24, 2018 (EP) .................................... 18153148

(51) Int. Cl.
*B25J 9/16* (2006.01)
*G06F 9/54* (2006.01)
(Continued)

(52) U.S. Cl.
CPC ............. *B25J 9/1666* (2013.01); *B25J 9/161* (2013.01); *B25J 9/163* (2013.01); *B25J 9/1671* (2013.01);
(Continued)

(58) Field of Classification Search
CPC combination set(s) only.
See application file for complete search history.

(56) References Cited

U.S. PATENT DOCUMENTS 9,643,316 B2 * 5/2017 Krasny .................. B25J 9/1666
10,131,053 B1 * 11/2018 Sampedro .............. B25J 9/1666
(Continued)

FOREIGN PATENT DOCUMENTS

CN 102152308 A 8/2011
CN 102947766 A 2/2013
(Continued)

OTHER PUBLICATIONS

Burger Ruben et al: "Automated tuning and configuration of path planning algorithms", 2017 IEEE International Conference on Robotics and Automation (ICRA), IEEE, pp. 4371-4376, XP033127293, DOI: 10.1109/ICRA.2017.7989504; [gefunden am Jul. 21, 2017], p. 1, col. 2; 2017.
(Continued)

*Primary Examiner* — Jeff A Burke
*Assistant Examiner* — Zachary Joseph Wallace
(74) *Attorney, Agent, or Firm* — Schmeiser, Olsen & Watts LLP

(57) ABSTRACT

Provided is a method for computer-aided user assistance during the activation of a movement planner for a machine, in which:
a user interface is provided and can be used by a user to specify parameterization data for the movement planner, wherein the parameterization data comprise a machine model and an environment model;
the collision-free movement space and the collision-prone movement space of the machine in the configuration space are determined on the basis of parameterization data specified via the user interface; one or more features with respect to the collision-free and/or collision-prone movement space are determined;
a predefined plausibility criterion is checked for a respective feature of at least some of the features, wherein, if
(Continued)

Figure 1:
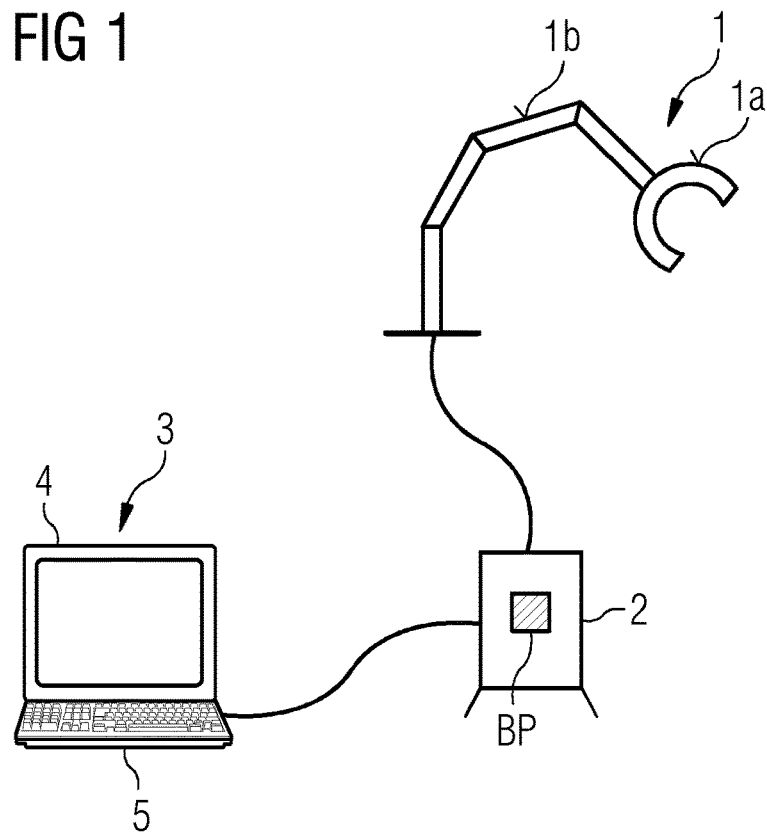

the plausibility criterion has not been satisfied, an output in the form of a warning message is produced via the user interface.

14 Claims, 1 Drawing Sheet

(51) Int. Cl.
  *G05B 19/4069* (2006.01)
  *G05B 19/4061* (2006.01)
  *G06F 30/17* (2020.01)

(52) U.S. Cl.
  CPC ..... *G05B 19/4061* (2013.01); *G05B 19/4069* (2013.01); *G06F 9/542* (2013.01); *G06F 30/17* (2020.01); *G05B 2219/40476* (2013.01); *G05B 2219/49137* (2013.01)

(56) References Cited

U.S. PATENT DOCUMENTS

| | | | | |
|---|---|---|---|---|
| 2008/0187097 | A1* | 8/2008 | Cheng | B25J 9/1666 378/65 |
| 2010/0217528 | A1* | 8/2010 | Sato | G05D 1/0214 701/301 |
| 2011/0196533 | A1* | 8/2011 | Scheurer | B25J 9/1666 700/255 |
| 2011/0213497 | A1* | 9/2011 | Nair | B25J 9/1666 700/255 |
| 2011/0264416 | A1 | 10/2011 | Muller et al. | |
| 2012/0215352 | A1* | 8/2012 | Eberst | G05B 19/4083 700/253 |
| 2013/0325030 | A1* | 12/2013 | Hourtash | A61B 34/37 606/130 |
| 2015/0094848 | A1 | 4/2015 | Bretschneider et al. | |
| 2015/0328776 | A1* | 11/2015 | Shiratsuchi | G05B 17/02 700/255 |
| 2016/0345929 | A1* | 12/2016 | Azizian | A61B 6/102 |
| 2016/0370165 | A1 | 12/2016 | Kelley et al. | |
| 2017/0190052 | A1* | 7/2017 | Jaekel | B25J 9/1666 |
| 2018/0001472 | A1 | 1/2018 | Konidaris et al. | |
| 2020/0078097 | A1* | 3/2020 | Gregerson | B25J 9/1666 |

FOREIGN PATENT DOCUMENTS

| | | |
|---|---|---|
| CN | 105005301 A | 10/2015 |
| CN | 106444769 A | 9/2017 |
| CN | 107206592 A | 9/2017 |
| CN | 108139210 A | 6/2018 |
| DE | 102015204641 A1 | 12/2015 |
| EP | 2853354 A1 | 4/2015 |

OTHER PUBLICATIONS

European Search report for Application No. 18153148.4, dated May 9, 2018.

* cited by examiner

METHOD FOR COMPUTER-AIDED USER ASSISTANCE DURING THE ACTIVATION OF A MOVEMENT PLANNER FOR A MACHINE

CROSS-REFERENCE TO RELATED APPLICATIONS

This application claims priority to EP Application No. 18153148.4, having a filing date of Jan. 24, 2018, the entire contents of which are hereby incorporated by reference.

FIELD OF TECHNOLOGY

The following relates to a method for computer-aided user assistance during the activation of a movement planner for a machine. The following also relates to a computer program product and to a computer program.

BACKGROUND

In many technical areas, machines are moved in an automated manner in order to perform particular tasks. Examples of such machines are industrial robots, medical devices or machine tools. Movement planners are usually used in the automated movement of machines, which movement planners are programs which determine suitable movement trajectories of the machine, such that no collisions occur between components of the machine or the environment.

Movement planners are generally generic programs which can be used for different types of machine and spatial environments. In order to adapt the movement planner to the current conditions, parameterization data are specified by a user via a user interface during the activation of the movement planner. These parameterization data comprise a machine model and an environment model. The machine model describes, inter alia, the geometric dimensions of the machine, whereas the environment model contains the geometric dimensions of the environment in which the machine is intended to be operated.

After a movement planner has been parameterized, collision-free movement trajectories (if available), which each run between a start configuration and a target configuration, specified by a user, in the configuration space of the machine, are calculated when using the movement planner in order to control the corresponding machine. The machine is controlled according to the respective trajectory, with the result that the machine moves along this trajectory in space.

After the parameterization of a movement planner has been concluded, it is often determined that planning requests for a multiplicity of start and target configurations require very long computing times for determining a collision-free trajectory or a collision-free trajectory cannot be found at all. The search for the causes of slow or failing planning requests is difficult and nowadays requires expert knowledge. It is therefore desirable to already identify during the activation of the movement planner within the scope of its parameterization whether the parameterization data have errors or problems, with the result that problems are avoided during subsequent use of the movement planner.

SUMMARY

An aspect relates to provide a method for computer-aided user assistance during the activation of a movement planner for a machine, which method is used to provide a user with information relating to possible errors or problems in the parameterization data for the movement planner.

The method according to embodiments of the invention is used for computer-aided user assistance during the activation of a movement planner for a machine. In this case, a movement planner is a planning program which can be executed via a suitable computer and is used to determine a collision-free movement of the machine in space. In this case, the term "machine" should be broadly understood and may in this case be any desired technical device or technical system which is provided for the purpose of carrying out automated movements. In particular, the machine may comprise an industrial robot or a medical device, in particular an imaging device, for example an x-ray device or a magnetic resonance tomograph. The machine may likewise comprise a machine tool.

Within the scope of the method according to embodiments of the invention, a user interface is provided and can be used by a user to specify parameterization data for the movement planner. In one variant, this specification can be effected by directly inputting the parameterization data via the user interface, for example by means of a keyboard and/or a computer mouse. The parameterization data may likewise have already been previously stored in a digital form in a corresponding memory, with the result that in this case the user specifies the parameterization data by specifying the corresponding digital data via the user interface.

The user interface used within the scope of the method according to embodiments of the invention may be configured differently and may comprise different input and output means. The user interface has a visual display device, for example a display, which is used to specify the parameterization data and on which the warning message described further below is displayed.

The parameterization data comprise a machine model and an environment model, wherein the machine model contains, inter alia, the geometric dimensions of the machine. In contrast, the environment model describes the geometric dimensions of the environment in which the machine is intended to be operated.

Within the scope of the method according to embodiments of the invention, the collision-free movement space and the collision-prone movement space of the machine in the configuration space are determined on the basis of parameterization data specified via the user interface, wherein the configuration space is a space of position vectors each representing a spatial position of the machine. In particular, the entries of these position vectors contain the possible positions of respective shafts of the machine. The configuration space is therefore a multi-dimensional space corresponding to the number of entries in the position vectors. The configuration space is produced by the machine model.

A collision-free movement space should be understood as meaning that region in the configuration space in which no collisions occur between parts of the machine or other objects. In contrast to this, the collision-prone movement space describes those locations in the configuration space at which there are collisions between parts of the machine and other objects. The corresponding determination of collision-free and collision-prone movement spaces is known per se and is therefore not described in any more detail.

After the collision-free movement space and the collision-prone movement space have been determined, one or more features with respect to the collision-free and/or collision-prone movement space are determined. A predefined plausibility criterion is then checked for a respective feature of at least some of the features, wherein, if the plausibility criterion has not been satisfied, an output in the form of a warning message is produced via the user interface.

The term "feature" should be broadly understood here and below. In particular, a feature need not consist of an individual value, but rather can also describe complex relationships and, for this purpose, can also comprise a plurality of variable values.

The method according to embodiments of the invention is distinguished by the fact that, during the activation of a movement planner, the parameterization data are subjected to an analysis in order to identify possible weak points and indicate them to the user. Problems can therefore be identified during parameterization without consulting a planning expert and suitable adaptations can be made before using the planner to control the actual machine.

Embodiments of the invention are based on the knowledge that features with respect to the collision-free and collision-prone movement space can be used to identify very well whether the subsequent movement planning using the corresponding movement planner can result in problems.

In one exemplary variant, the method according to embodiments of the invention is used in combination with a movement planner which can be operated with different planning algorithms, wherein these planning algorithms can possibly be specified via the user interface. In this case, the warning message comprises a recommendation for at least one of these planning algorithms which is best suited to the specified parameterization data. Examples of corresponding recommendations are given in the detailed description.

In another exemplary variant, the ratio of the volume of the collision-free movement space to the volume of the configuration space or of the collision-prone movement space is determined as a (checked) feature, wherein the plausibility criterion has been satisfied when the ratio exceeds a predefined threshold. In this case, use is made of the knowledge that a low volume of the collision-free movement space often results in the failure of the movement planning or in a long computing time.

In another configuration of the method according to embodiments of the invention, the number of separate contiguous collision-free areas and possibly also their position and/or volume in the configuration space are determined as a (checked) feature, wherein the plausibility criterion has been satisfied when there is only one contiguous area. In a contiguous area, each pair of two points can be reached via a movement trajectory without leaving the area. This variant is based on the knowledge that the movement planning often fails in the case of a plurality of separate contiguous collision-free areas since, if the start and target configurations are unfavorably selected, each movement trajectory must always run through a collision-prone region between two separate contiguous collision-free areas.

In another configuration of the method according to embodiments of the invention, the warning message output via the user interface comprises the notification that the machine model and/or the environment model possibly has/have errors. This variant is combined with the two embodiments described above. In particular, the notification that the machine model possibly has errors is output if the above plausibility criterion relating to the ratio of the volume of the collision-free movement space is checked as a feature. In contrast, if the checked feature comprises the number of separate contiguous collision-free areas in the configuration space, the notification that the environment model possibly has errors is output. The notification may comprise, for example, a statement that components of the machine could have been modeled too roughly (that is to say with an insufficient degree of detail) or could have been placed incorrectly. The notification may likewise comprise a statement that objects, for example artificial obstacles, may possibly have been modeled on an excessively large scale. Specific configurations of corresponding notifications are mentioned again in the detailed description.

In another variant of the method according to embodiments of the invention, when determining the collision-free movement space and the collision-prone movement space, the configuration space is sampled and, for each sample value, it is determined whether or not the sample value (that is to say the corresponding position vector in the configuration space) results in collisions. The volume and the position of these movement spaces are therefore determined in a sampling-based manner.

In one exemplary variant of the embodiment just described, when sampling the configuration space, the frequency of the occurrence of respective machine components in the collision-prone movement space with respect to the total number of sample values is determined as a (checked) feature. In this case, the plausibility criterion has been satisfied when the frequency of the occurrence of at least one machine component exceeds a predefined threshold value, wherein the warning message contains, for each machine component whose frequency exceeds the predefined threshold value, the notification that this machine component has possibly been modeled incorrectly (for example on an excessively large scale or too roughly). Detailed information relating to problematic machine components is output in this manner using the warning message.

In another configuration of the method according to embodiments of the invention, a planning request with a start configuration and a target configuration of the machine in the configuration space can also be specified via the user interface, wherein it is determined, on the basis of a determined feature specifying the position and the volume of separate contiguous collision-free areas in the configuration space, whether the planning request can be tackled, wherein, if the planning request cannot be tackled, an error message is output via the user interface. In particular, the planning request cannot be tackled when the start configuration and the target configuration are in different separate contiguous collision-free areas or when the start position and/or the target position is/are outside a separate contiguous collision-free area.

In another configuration of embodiments of the invention in which a planning request with a start configuration and a target configuration of the machine can likewise be specified via the user interface, a multiplicity of movement trajectories between the start configuration and the target configuration are calculated when processing a specified planning request until a movement trajectory in the collision-free movement space has been found or an abort criterion has been satisfied. In this case, the frequency of the occurrence of respective machine components in the collision-prone movement space with respect to the total number of calculated movement trajectories is determined for the calculated movement trajectories and a warning notification is output via the user interface for machine components whose frequency exceeds a predefined limit value. In this manner, the user receives a notification of machine components which have possibly been modeled on an excessively large scale or too roughly.

In addition to the method described above, embodiments of the invention relate to an apparatus for computer-aided user assistance during the activation of a movement planner for a machine, wherein the apparatus is set up to carry out the method according to embodiments of the invention or one or more exemplary variants of the method according to embodiments of the invention.

Embodiments of invention also relate to a machine which can be controlled via a movement planner, wherein the machine comprises the apparatus according to embodiments of the invention just described for computer-aided user assistance during the activation of the movement planner.

Embodiments of the invention also comprises a computer program product(non-transitory computer readable storage medium having instructions, which when executed by a processor, perform actions) having a program code which is stored on a machine-readable carrier and is intended to carry out the method according to embodiments of the invention or one or more exemplary variants of the method according to embodiments of the invention when the program code is executed on a computer. Embodiments of the invention also relates to a computer program having a program code for carrying out the method according to embodiments of the invention or one or more exemplary variants of the method according to embodiments of the invention when the program code is executed on a computer.

BRIEF DESCRIPTION

Figure 2:
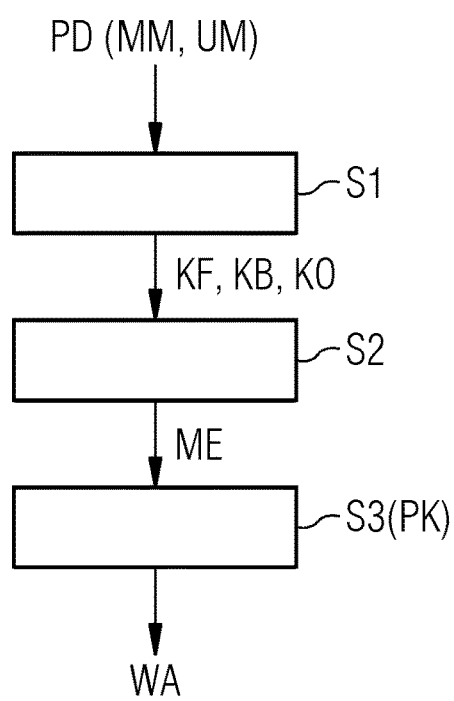

Some of the embodiments will be described in detail, with reference to the following figures, wherein like designations denote like members, wherein:

FIG. 1 shows a schematic illustration of a medical device having an apparatus for user assistance based on one embodiment of the invention; and FIG. 2 shows a flowchart which illustrates the performance of one embodiment of the method according to the invention.

DETAILED DESCRIPTION

One variant of the method according to embodiments of the invention is explained below, by way of example, on the basis of the movement planning of a medical device in the form of a C-arm.

FIG. 1 shows the C-arm 1 having a front C-shaped x-ray device 1a which can be moved into a multiplicity of positions with respect to a patient (not illustrated) via an articulated arrangement 1b in order to x-ray particular regions of the patient's body. So that the C-arm carries out movements which do not result in a collision with itself or with objects in the environment, use is made of a movement planner BP in the form of a program which is executed in a computer 2. The movement planner is designed for use for different types of C-arm and in different spatial environments. Therefore, parameterization data must be specified for the movement planner. These parameterization data are input via a user interface 3 and are stored in the movement planner BP. For this purpose, the user interface comprises a visual display means or visual display in the form of a screen 4 and a keyboard 5.

In order to determine possible errors in the parameterization data before actually executing the movement planner for controlling the C-arm 1, use is made of the method for user assistance which is described below and is implemented by means of program code in the computer 2. In this case, it should be noted that the method need not necessarily run on a computer which is used to control the actual machine. Rather, the method for user assistance may also be carried out independently of the machine to be controlled on a computer with the movement planner stored therein in combination with a user interface. After the movement planner has been parameterized with the aid of the method for user assistance, the planner must then be transmitted to the corresponding computer for controlling the machine.

According to the method in FIG. 2, parameterization data PD which have been input by a user via the user interface 3 are processed. Such parameterization data are known per se and comprise a machine model MM and an environment model UM. The machine model MM describes, inter alia, the geometric dimensions of the corresponding machine which is a C-arm in the example in FIG. 1. The environment model UM describes the spatial conditions in the environment of the machine, in particular the positions of walls and ceilings and of other objects in the space in which the machine is situated. Instead of inputting the parameterization data directly via the user interface, the user can also specify these data in another manner, for example by stipulating a file from which the parameterization data are intended to be read via the user interface.

After the parameterization data PD have been read in, the collision-free movement space KF and the collision-prone movement space KB of the machine in the configuration space KO are determined in step S1 in FIG. 2, wherein the configuration space is a space of position vectors which contain, as entries, the possible positions of respective shafts of the machine. In this case, a range of values representing the possible shaft values is provided for each of the entries. These values are angle specifications for articulated shafts and length specifications for telescopic shafts.

The configuration space KO is given by the machine model MM. The collision-free movement space KF describes areas in the configuration space KO in which there can be no collisions between machine components or between the machine and other objects. In contrast, the collision-prone movement space KB describes regions in the configuration space KO in which there are collisions between machine components or between the machine and other objects.

After the movement spaces KF and KB have been determined, one or more features ME with respect to the collision-free or collision-prone movement space are determined in step S2 in FIG. 2. A predefined plausibility criterion PK is checked for one or more of these features in step S3, wherein, if the plausibility criterion has not been satisfied, a warning message WA is output via the user interface.

Examples of features ME and warning messages WA based thereon are given below. In one variant, the relative volume of the collision-free movement space, that is to say the ratio of the collision-free movement space to the entire configuration space, can be determined as a feature ME. In this case, the plausibility criterion PK is a threshold for this volume, in which case the criterion has not been satisfied if this threshold is undershot. In other words, the plausibility criterion is used to indicate that the collision-free movement space is very small and therefore there is a great risk of collisions. If the plausibility criterion has not been satisfied, a warning message WA is output in the described scenario, which warning message notifies the user that there is possibly an error in the machine model and individual components of the machine could have been modeled too roughly (that is to say with an insufficient fine granularity) or could have been placed incorrectly.

If it should be possible for the planner BP to use different planning algorithms, a proposal for a suitable planner on the basis of the relative volume of the collision-free movement space can also possibly be provided when outputting the warning message WA. In this case, planners with systematic searches are proposed via the warning notification in the case of relatively small volumes, whereas sampling-based planners are recommended in the case of larger volumes. Said types of planners are sufficiently well known to a person skilled in the art.

In another embodiment, the number of separate contiguous collision-free areas in the configuration space is determined as a feature ME. In a contiguous area, each pair of two points can be reached in this case via a movement trajectory without leaving the area. In this case, the plausibility criterion PK is configured in such a manner that it has been satisfied only in the case of an individual separate contiguous collision-free area. If there are a plurality of separate contiguous collision-free areas, this indicates an error in the environment model UM. Consequently, a warning message WA is output in this case and indicates that objects, for example artificial obstacles inserted for safety reasons, have possibly been modeled on an excessively large scale or at an incorrect location.

If the variant just described should be combined with a movement planner in which different planning algorithms can be used, a tree-based planning algorithm is recommended in one embodiment via the warning message in the case of a larger number of separate contiguous areas, whereas roadmap-based planning algorithms are proposed in the case of less contiguous areas. Said types of planners are sufficiently well known to a person skilled in the art.

In another variant of the method according to embodiments of the invention, the collision-prone movement space and the collision-free movement space are determined by means of sampling in the configuration space. In this case, a multiplicity of position vectors in the configuration space are sampled in a suitable manner (for example randomly), wherein, for these vectors, it is determined whether or which machine components of the machine are in the collision-prone movement space. This is used to determine the relative frequency of respective machine components in the collision-prone movement space by dividing the number of occurrences of machine components in the collision-prone movement space for sampled position vectors by the total number of sampled position vectors.

In the embodiment just described, the plausibility criterion PK is configured in such a manner that a warning message WA is output when the relative frequency of at least one machine component exceeds a predefined threshold. In this case, the warning message also states which machine components have exceeded the threshold. The user also receives the notification that these machine components could have been modeled on an excessively large scale or too roughly in the machine model.

The features ME determined within the scope of the method in FIG. 2 can possibly also be used to analyze planning requests directed to the movement planner BP. In this case, a planning request in the form of a start configuration and a target configuration in the configuration space of the machine can also be input or specified via the user interface 3. The feature of the position and the volume of separate contiguous collision-free areas can then be used to determine whether the start configuration and the target configuration are in different collision-free areas or whether the start position and/or the target position is/are outside the collision-free area. If this is the case, there is no collision-free movement trajectory for the machine. In this case, an error message is output via the user interface and indicates that the planning request cannot be tackled.

If the movement planner BP should be configured in such a manner that it tests a multiplicity of trajectories for freedom from collisions in order to determine a suitable movement trajectory between the start configuration and the target configuration, it is also possible to determine when processing the planning request in a further variant how often respective machine components for the tested movement trajectories are in the collision-prone movement space. In other words, the quotient of the number of occurrences of the respective machine component in the collision-prone movement space for the tested movement trajectories and the total number of trajectories is formed for a respective machine component. Should this frequency exceed a predetermined limit value for one or more machine components, the information stating that this machine component has possibly been modeled too roughly or on an excessively large scale is output via the user interface for each of these machine components.

The embodiments of the invention described above have a number of advantages. In particular, the user is provided with notifications of possible errors in the parameterization of a movement planner during the activation of the movement planner in an automated manner without the help of experts being required for this purpose. This accelerates the activation of the planner and reduces the costs of consulting planning experts. In addition, the method according to embodiments of the invention can possibly assist the user even with planning requests and can notify the user of planning requests which cannot be carried out or of possible errors in the movement model or environment model.

Although the present invention has been disclosed in the form of preferred embodiments and variations thereon, it will be understood that numerous additional modifications and variations could be made thereto without departing from the scope of the invention.

For the sake of clarity, it is to be understood that the use of 'a' or 'an' throughout this application does not exclude a plurality, and 'comprising' does not exclude other steps or elements.

The claims are as follows:

1. A method for computer-aided user assistance during the activation of a movement planner for a machine, comprising:

providing a user interface used by a user to specify parameterization data for the movement planner, wherein the parameterization data comprise a machine model and an environment model, wherein the machine model contains the geometric dimensions of the machine and the environment model contains the geometric dimensions of the environment in which the machine is intended to be operated;

determining a collision-free movement space and a collision-prone movement space of the machine in a configuration space on the basis of parameterization data specified via the user interface, wherein the configuration space is a space of position vectors each representing a spatial position of the machine, wherein the collision-free movement space is a region in the configuration space in which no collisions occur between parts of the machine and/or other objects, wherein the collision-prone movement space is a region in the configuration space at which there are collisions between parts of the machine and/or other objects;

determining one or more features with respect to at least one of the collision-free and collision-prone movement space, wherein a ratio of the volume of the collision-free movement space to the volume of the configuration space or of the collision-prone movement space is determined as a feature; and checking a predefined plausibility criterion for a respective feature of at least some of the features, wherein the plausibility criterion for the ratio of the volume of the collision-free movement space to the volume of the configuration space or of the collision-prone movement space has been satisfied when the ratio exceeds a predefined threshold, wherein, if the plausibility criterion has not been satisfied, an output in the form of a warning message is produced via the user interface, and if the plausibility criterion is satisfied, the movement planner for the machine is executed to control the machine, wherein checking the predefined plausibility criterion is performed before execution of movement planning by the movement planner to control the machine.

2. The method as claimed in claim 1, wherein the movement planner is operated with different planning algorithms, wherein the warning message comprises a recommendation for at least one of these planning algorithms which is best suited to the specified parameterization data.

3. The method as claimed in claim 1, wherein the warning message comprises a notification that at least one of the machine model and the environment model possibly has an error.

4. The method as claimed in claim 1, wherein the number of separate contiguous collision-free areas in the configuration space is determined as a feature, wherein the plausibility criterion has been satisfied when there is only one separate contiguous collision-free area.

5. The method as claimed in claim 1, wherein, when determining the collision-free movement space and the collision-prone movement space, the configuration space is sampled and, for each sample value, it is determined whether or not the sample value results in collisions.

6. The method as claimed in claim 5, wherein, when sampling the configuration space, the frequency of the occurrence of respective machine components in the collision-prone movement space with respect to the total number of sample values is determined as a feature, and the plausibility criterion has been satisfied when the frequency of the occurrence of at least one machine component exceeds a predefined threshold value, wherein the warning message contains, for each machine component whose frequency exceeds the predefined threshold value, the notification that this machine component has possibly been modeled incorrectly.

7. The method as claimed in claim 1, wherein a planning request with a start configuration and a target configuration of the machine can also be specified via the user interface, wherein it is determined, on the basis of a determined feature specifying the position and the volume of separate contiguous collision-free areas in the configuration space, whether a specified planning request is tackled, wherein, if the planning request cannot be tackled, an error message is output via the user interface.

8. The method as claimed in claim 1, wherein a planning request with a start configuration and a target configuration of the machine can also be specified via the user interface and a multiplicity of movement trajectories between the start configuration and the target configuration are calculated when processing a specified planning request until a movement trajectory in the collision-free movement space has been found or an abort criterion has been satisfied, wherein the frequency of the occurrence of respective machine components in the collision-prone movement space with respect to the total number of calculated movement trajectories is determined for the calculated movement trajectories and a warning notification is output via the user interface for machine components whose frequency exceeds a predefined limit value.

9. The method as claimed in claim 1, wherein the machine comprises an industrial robot or a medical device, in particular an imaging device, or a machine tool.

10. A computer program product comprising a computer readable hardware storage device having computer readable program code stored therein, said program code executable by a processor of a computer system to implement the method as claimed in claim 1 when the computer readable program code is executed on the computer system.

11. An apparatus for computer-aided user assistance during the activation of a movement planner for a machine, comprising:

a user interface which is used by a user to specify parameterization data for the movement planner, wherein the parameterization data include a machine model and an environment model, wherein the machine model contains the geometric dimensions of the machine and the environment model contains the geometric dimensions of the environment in which the machine is intended to be operated;

a computer which is set up to determine the collision-free movement space and the collision-prone movement space of the machine in the configuration space on the basis of parameterization data specified via the user interface, wherein the configuration space is a space of position vectors each representing a spatial position of the machine, wherein the collision-free movement space is a region in the configuration space in which no collisions occur between parts of the machine and/or other objects, wherein the collision-prone movement space is a region in the configuration space at which there are collisions between parts of the machine and/or other objects;

to determine one or more features with respect to the collision-free and/or collision-prone movement space, wherein a ratio of the volume of the collision-free movement space to the volume of the configuration space or of the collision-prone movement space is determined as a feature; and to check a predefined plausibility criterion for a respective feature of at least some of the features, wherein the plausibility criterion for the ratio of the volume of the collision-free movement space to the volume of the configuration space or of the collision-prone movement space has been satisfied when the ratio exceeds a predefined threshold, wherein, if the plausibility criterion has not been satisfied, the computer triggers an output via the user interface in the form of a warning message, and if the plausibility criterion is satisfied, the movement planner for the machine is executed to control the machine;

wherein the check of the predefined plausibility criterion is performed before executing the movement planner to control the machine.

12. The apparatus as claimed in claim 11, the movement planner is operated with different planning algorithms, wherein the warning message comprises a recommendation for at least one of these planning algorithms which is best suited to the specified parameterization data.

13. A machine which is controlled via a movement planner, wherein the machine comprises the apparatus as claimed in claim 11 for computer-aided user assistance during the activation of the movement planner.

14. The apparatus of claim 11, wherein the warning message comprises a notification that at least one of the machine model and the environment model possibly has an error.

* * * * *